United States Patent [19]

Matsuura et al.

[11] Patent Number: 5,438,036
[45] Date of Patent: Aug. 1, 1995

[54] PLANAR SQUID OF OXIDE SUPERCONDUCTOR

[75] Inventors: Takashi Matsuura; Hideo Itozaki, both of Hyogo, Japan

[73] Assignee: Sumitomo Electric Industries, Ltd., Osaka, Japan

[21] Appl. No.: 48,001

[22] Filed: Apr. 19, 1993

[30] Foreign Application Priority Data

Apr. 17, 1992 [JP] Japan ................................. 4-124315

[51] Int. Cl.$^6$ ...................... G01R 33/00; H01L 39/22; H01L 39/14; H01L 39/24
[52] U.S. Cl. .................... 505/162; 505/190; 505/329; 505/702; 505/832; 505/874; 505/846; 505/922; 257/33; 257/34
[58] Field of Search .................. 324/248; 257/31, 32, 257/33, 34, 35, 36; 365/160, 162; 307/306; 505/162, 190, 329, 702, 817, 832, 846, 873, 874, 922

[56] References Cited

U.S. PATENT DOCUMENTS 5,157,466 10/1992 Char et al. ......................... 257/34

FOREIGN PATENT DOCUMENTS 224677 10/1985 France ................................. 324/248
56-46580 4/1981 Japan ................................. 257/34

OTHER PUBLICATIONS

Matlashov et al., "High Sensitive Magnetometers and Gradiometers Based on DC SQUIDS with Flux Focuser", IEEE Trans. on Magnetics, vol. 27, No. 2, Mar. 1991, pp. 2963–2966.
Zhang et al., "Low–Noise YBa$_2$Cu$_3$O$_7$ rf SQUID Magnetometer," Applied Physics Letters, vol. 60, No. 5, Feb. 3, 1992, pp. 645–647.
Zhang et al., "Sensitive rf-SQUIDs and Magnetometers Operating at 77K," IEEE Trnas. on Magnetics, vol. 3, No. 1, Mar. 1993, pp. 2465–2468.
Enpuku et al., "DC Superconducting Quantum Inteference Device Utilizing the High T$_c$ Step-Edge Junction", Journal of Applied Physics, vol. 30, No. 6B, Jun. 1991, pp. L1121–L1124, Japanese.
Gross et al., "Low Noise YBa$_2$Cu$_3$O$_{7-\delta}$ Grain Boundary Junction dc SQUIDs", Applied Physics Letters, vol. 57, No. 7, Aug. 1990, pp. 727–729.
Oh et al., "YBaCuO Input Coils with Low T$_c$ and High T$_c$ SQUIDs", Applied Physics Letters, vol. 56, No. 25, Jun. 1990, pp. 2575–2577.
Tanaka et al.,"Properties of YBa$_2$Cu$_3$O$_{7-y}$ Large Washer SQUIE", Japanese Journal of Applied Physics, vol. 32, No. 5A, May 1993, pp. L662–L664.

Primary Examiner—Jerome Jackson
Assistant Examiner—Alice W. Tang
Attorney, Agent, or Firm—Foley & Lardner

[57] ABSTRACT

A SQUID comprises a substrate, a washer of an oxide superconductor thin film formed on a principal surface of the substrate, a hole shaped a similar figure to the washer at the center of the washer, a slit formed between one side of the washer and the hole, and a Josephson junction which connects portions of the washer at the both sides of the slit across the slit. In the SQUID, the ratio of similarity of the washer to the hole ranges 100 to 2500.

20 Claims, 4 Drawing Sheets

PLANAR SQUID OF OXIDE SUPERCONDUCTOR

BACKGROUND OF THE INVENTION

1. Field of the Invention

The present invention relates to a planar SQUID (Superconducting QUantum Interference Device) of an oxide superconductor, and more specifically to a sensitive planar SQUID of an oxide superconductor.

2. Description of Related Art

A SQUID is a sensitive magnetism sensor utilizing a Josephson junction, which is capable of measuring extremely weak flux less than flux quantum $\phi_0(=h/2e$, h: Planck's constant, e: charge of an electron) by converting the flux into voltage. The SQUID has a superconducting loop and one or two Josephson junctions which are inserted to the superconducting loop. The SQUID which has one Josephson junction is called a RF-SQUID and the one which has two Josephson junctions is called a DC-SQUID.

When the SQUID is used as a magnetic sensor, the SQUID is usually associated with a superconducting flux transformer in order to increase its sensitivity. The superconducting flux transformer is constituted of two superconducting coils of different sizes connected in parallel, which are called a pickup coil and an input coil. The input coil is the smaller one which has a size close to that of the SQUID and is placed on the SQUID. The pickup coil is the larger one which detects flux and is arranged apart from the SQUID. The SQUID and the input coil are usually arranged in a magnetic shield.

The flux detected by the pickup coil is concentrated to the input coil and the SQUID measures the concentrated flux. By this, the substantial sensitivity of the SQUID increases in relation to the self conductance ratio of the pickup coil to the input coil.

FIG. 1 shows a conventional planar DC-SQUID associated with an input coil of the superconducting flux transformer, which is disclosed by M. B. Kechen et al. in Appl. Phys. Lett., 44, 736 (1982). In FIG. 1, the SQUID 1 is mainly constituted of a washer 10 of a square superconducting thin film of which a side has a length of l, which has a square hole 11 at the center, of which a side has a length of $\sigma$.

The superconducting thin film of the washer 10 overlaps at a portion 19 and the overlap portion 19 is connected to the overlapped portion of the washer 10 through two Josephson junctions (not shown) connected in series. The washer 10 has two tongue portions 14 and 15, in order to connect the SQUID 1 to a signal processor (not shown).

An input coil 3 of a superconducting flux transformer is arranged on the SQUID 1 and isolated from the SQUID 1. The input coil 3 is formed of a helical rectangular shaped superconducting coil. The input coil 3 is connected to the pickup coil (not shown) of the superconducting flux transformer.

In the above mentioned conventional planar SQUID, the length l of the side of the washer ranges from 100 to 500 μm and the length $\sigma$ of the side of the hole ranges from 10 to 100 μm and the ratio of l to $\sigma$ ranges 10 to a few tens.

The pickup coil of the superconducting flux transformer has a size on the order of 1 mm. Therefore, it is difficult to miniaturize the SQUID associated with the superconducting flux transformer or to form it into one tip device. In addition, a fine and complicated processing is needed to realize the SQUID on which the input coil of the superconducting flux transformer is integrally formed.

However, the conventional SQUID does not has sufficient sensitivity alone that it can detect and measure the biological magnetism without the superconducting flux transformer.

SUMMARY OF THE INVENTION

Accordingly, it is an object of the present invention to provide a high sensitive planar SQUID composed of an oxide superconductor material, which have overcome the above mentioned defects of the conventional ones.

The above and other objects of the present invention are achieved in accordance with the present invention by a SQUID comprising a substrate, a washer of an oxide superconductor thin film formed on a principal surface of the substrate, a hole shaped similar to the washer at the center of the washer, a slit formed between one side of the washer and the hole, and a Josephson junction by which portions of the washer at the both sides of the slit are connected across the slit, in which the ratio of similarity of the washer to the hole ranges from 100 to 2500.

In the SQUID in accordance with the present invention, the flux focussing effect increases flux which penetrates the hole, so that the sensitivity or magnetic field resolution of the SQUID is improved. Therefore, the SQUID in accordance with the present invention is capable of detecting and measuring the biological magnetism without the superconducting flux transformer.

If the ratio of similarity of the washer to the hole is less than 100, the sensitivity or magnetic field resolution of the SQUID is not so improved that the SQUID is able to detect and measure the biological magnetism without the superconducting flux transformer. On the contrary, if the ratio excesses 2500, the SQUID becomes too large, so that the space resolution is spoiled.

Preferably, in the SQUID in accordance with the present invention, the ratio of similarity of the washer to the hole ranges 200 to 2000.

In one preferred embodiment, the washer and the hole of the SQUID in accordance with the present invention are square. If their shapes have poor symmetry, the SQUID has an isotropic characteristics or sensitivity which will become an obstacle for the practical application. In this case, it is preferable that a side length of the washer ranges from 1 to 25 mm and a side length of the hole ranges 10 to 200 μm.

According to the present invention, the Josephson junction of the SQUID is of weak link type constituted of a grain boundary of the oxide superconductor. Since the weak link type Josephson junction can be easily formed without a extremely fine processing by utilizing a grain boundary of the oxide superconductor crystals, it is favorable that the Josephson junction of the SQUID of the present invention is constituted of a grain boundary of the oxide superconductor.

In a preferred embodiment, the oxide superconductor thin film is formed of a high-$T_c$ (high critical temperature) oxide superconductor, particularly, formed of a high-$T_c$ copper-oxide type compound oxide superconductor for example a Y—Ba—Cu—O type compound oxide superconductor material, a Bi—Sr—Ca—Cu—O type compound oxide superconductor material, and a Tl—Ba—Ca—Cu—O type compound oxide superconductor material.

In addition, the substrate can be formed of a single crystal oxide substrate such as a MgO (100) substrate, a SrTiO$_3$ (110) substrate, an yttrium stabilized zirconia (YSZ) substrate, etc.

According to one preferred embodiment of the present invention, the SQUID comprising a substrate having a hexahedron concavity on a surface, a square washer having two tongue portions of an oxide superconductor thin film formed on the surface of the substrate, a square hole at the center of the washer, a slit formed between the tongue portions to the hole, and a member of an oxide superconductor thin film including two Josephson junctions connected in series, which connects the two tongue portions across the slit, in which the ratio of similarity of the washer to the hole is 500 and the Josephson junctions are constituted of grain boundaries of the oxide superconductor at steps between the surface of the substrate and the bottom of the concavity.

The above and other objects, features and advantages of the present invention will be apparent from the following description of preferred embodiments of the invention with reference to the accompanying drawings.

DESCRIPTION OF THE PREFERRED EMBODIMENTS

Figure 1:
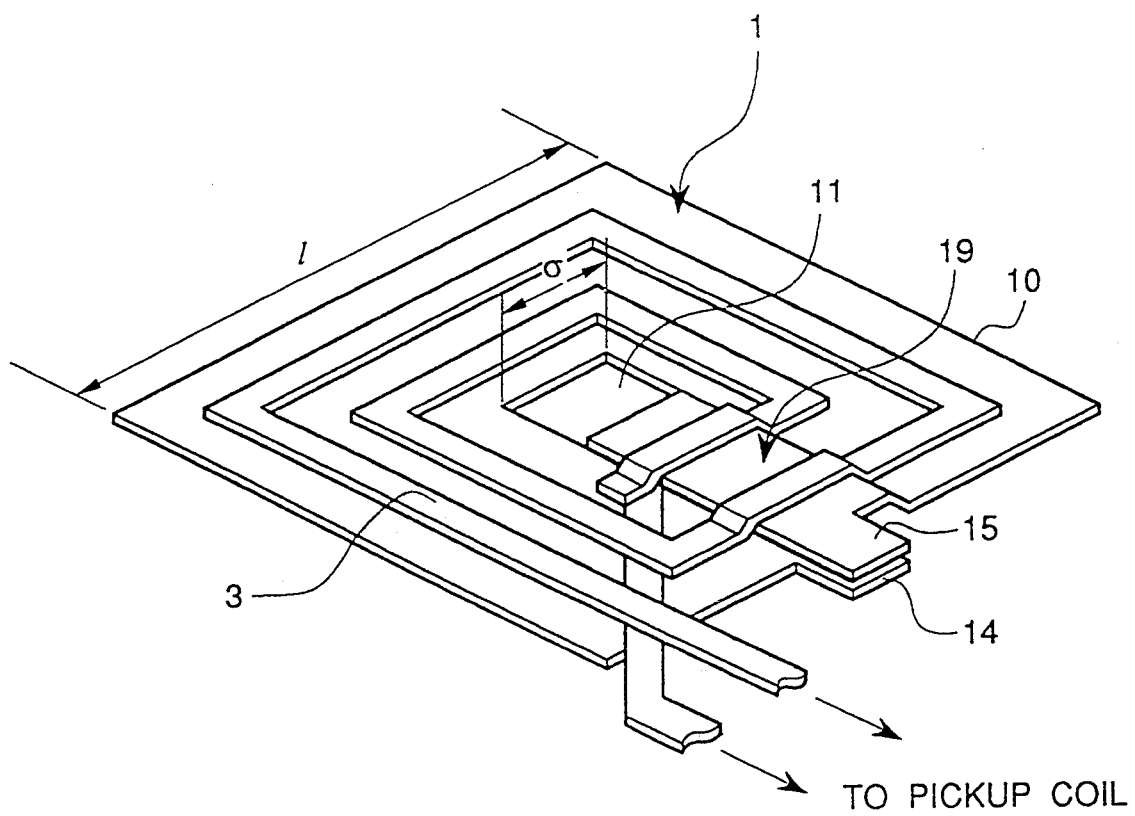
FIG. 1 is a schematic view a conventional planar SQUID associated with an input coil of the superconducting flux transformer.
Figure 2:
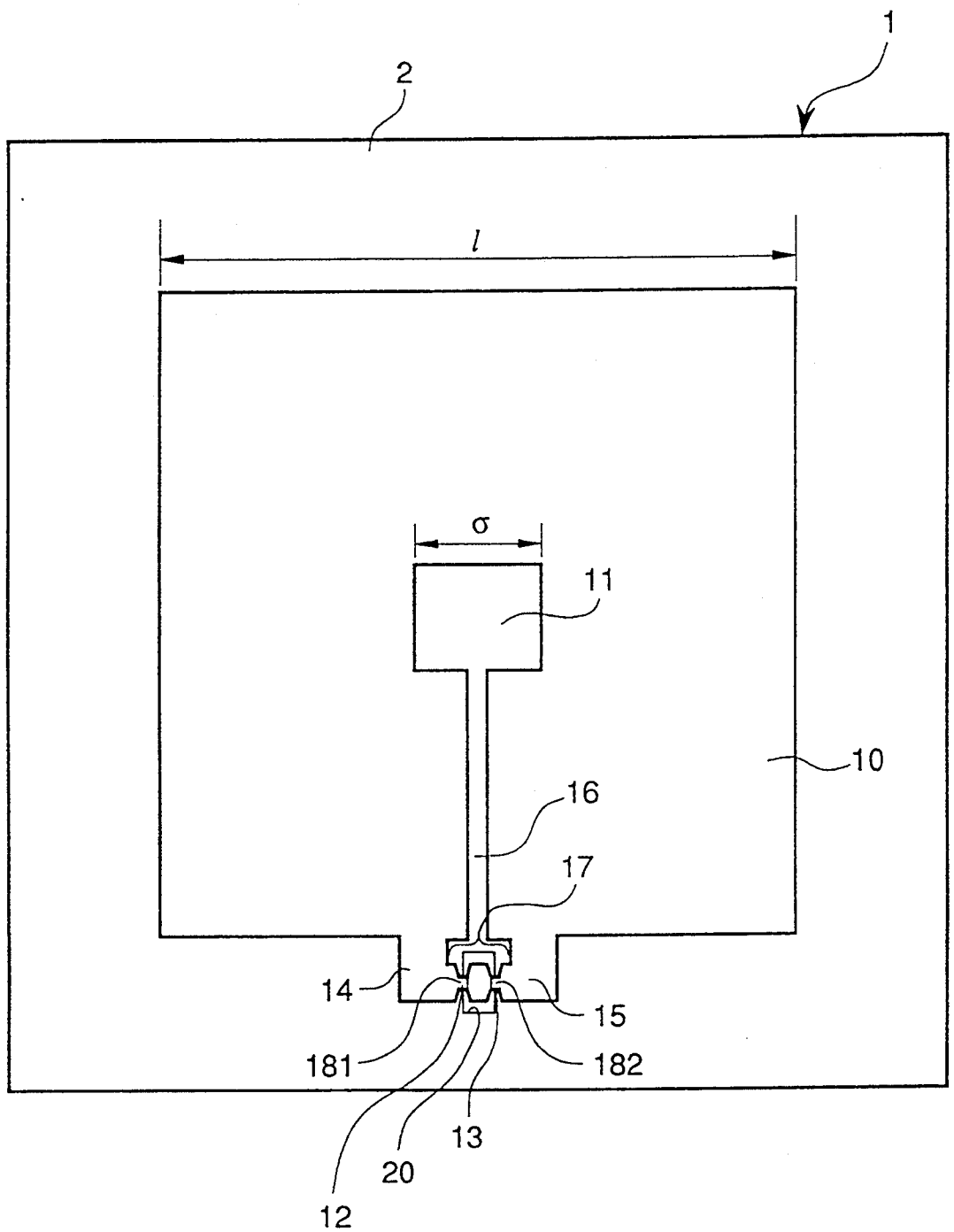
FIG. 2 is a diagrammatic plane view of a preferred embodiment of the planar DC-SQUID in accordance with the present invention.

FIG. 2 shows a diagrammatic plan view of an embodiment of the planar DC-SQUID in accordance with the present invention. The DC-SQUID 1 includes a SrTiO$_3$ (100) substrate 2 and a washer 10 of a square shaped c-axis orientated Y$_1$Ba$_2$Cu$_3$O$_{7-\delta}$ oxide superconductor thin film formed on the substrate 2, at the center of which a square hole 11 is formed. The oxide superconductor thin film has a thickness of 500 nanometers. A side of the washer 10 has a length l of 10 mm and a side of the hole 11 has a length $\sigma$ of 20 $\mu$m.

The washer 10 has tongue portions 14 and 15 on its one side and a slit 16 having a width of 5 $\mu$m formed between the tongue portions 14 and 15, which reaches the hole 11. The leading edges of the tongue portions 14 and 15 are connected by a member 17 of the oxide superconductor thin film, which has two bridge portions 181 and 182 at which Josephson junctions 12 and 13 of weak link type are respectively formed. In other words, the leading edges of the tongue portions 14 and 15 are connected through the Josephson junctions 12 and 13. The DC-SQUID 1 is connected to a signal processor (not shown) through the tongue portions 14 and 15.

The washer 10 and the hole 11 need not be square. However, if their shapes have poor symmetry, the DC-SQUID has an isotropic characteristics or sensitivity which will become an obstacle for the practical application. Therefore, the washer 10 and the hole 11 preferably have rectangular, almost square, similar shapes.

The ratio of a side length I of the washer 10 to $\sigma$ that of the hole 11 of the above DC-SQUID is 500. By this, the flux focussing effect increases flux which penetrates the hole 11, so that the sensitivity or magnetic field resolution of the DC-SQUID is improved. Therefore, the DC-SQUID is capable of detecting and measuring the biological magnetism without the superconducting flux transformer. The ratio of a side length of the washer 10 to that of the hole 11 is not limited to 500, but preferably ranges 100 to 2500 and more preferably 200 to 2000.

The oxide superconductor thin film which constitutes the DC-SQUID is preferably formed of a high-T$_c$ (high critical temperature) oxide superconductor material, particularly a high-T$_c$ copper-oxide type compound oxide superconductor material, for example, a Bi—Sr—Ca—Cu—O type compound oxide superconductor material, or a Tl—Ba—Ca—Cu—O type compound oxide superconductor material other than a Y—Ba—Cu—O type compound oxide superconductor material.

Figure 3:
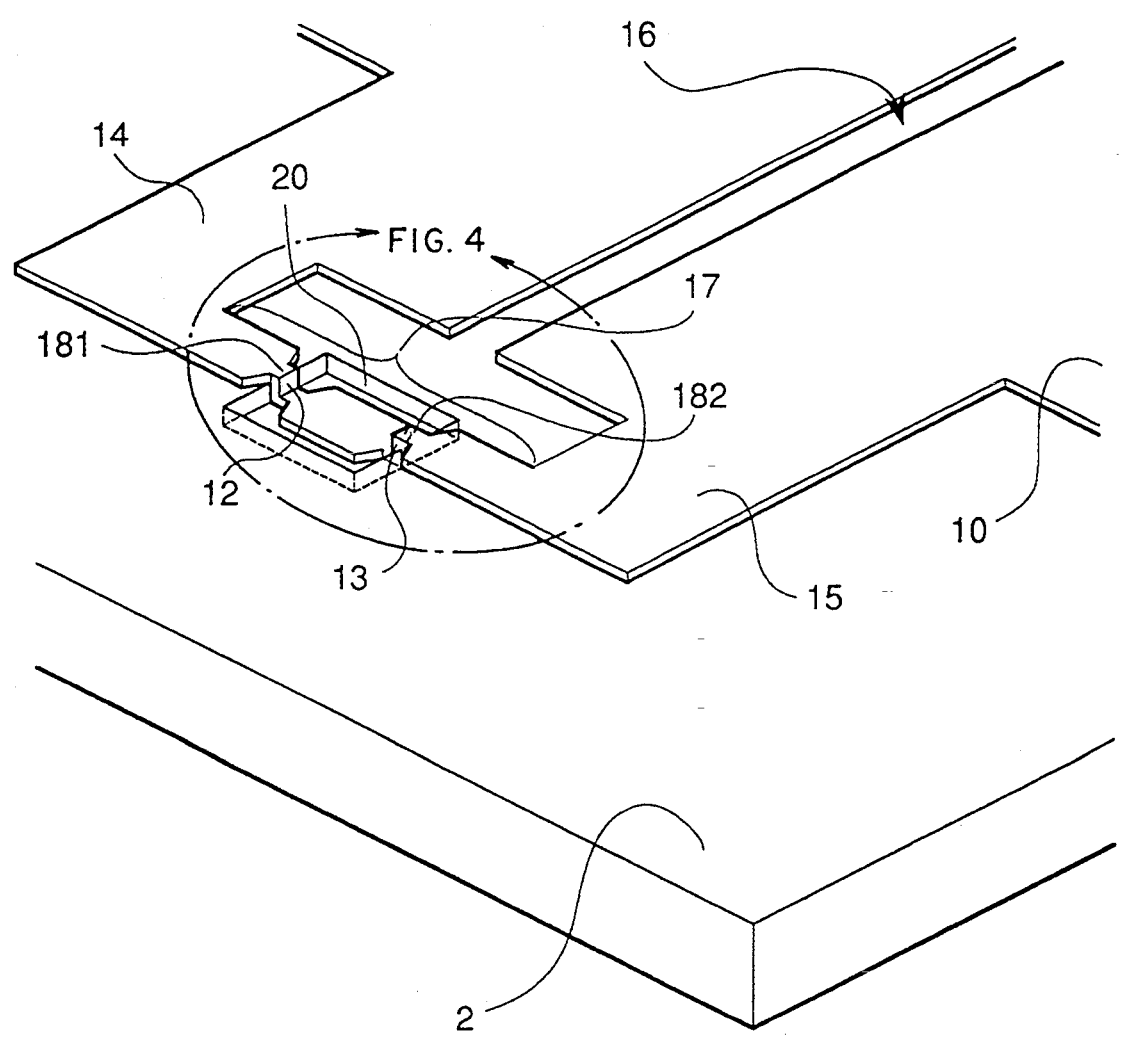
FIG. 3 is an enlarged detail of the DC-SQUID shown in FIG. 2.

FIG. 3 is an enlarged detail of a part of the DC-SQUID shown in FIG. 2. In FIG. 3, the member 17, the bridge portions 181 and 182, and the Josephson junctions 12 and 13 are shown in detail.

The member 17 connects the leading edges of the tongue portions 14 and 15, which has two bridge portions 181 and 182. A center portion of the member 17 is arranged at the bottom of a hexahedron concavity 20 of the substrate 2 and the bridge portions 181 and 182 are formed so as to cross the steps between the surface of the substrate 2 and the bottom of the concavity 20. The Josephson junctions 12 and 13 are formed at the bridge portions 181 and 182, which are constituted of grain boundaries of the oxide superconductor formed at the step portions.

The bridge portions 181 and 182 have a length of 1 $\mu$m and a width of 0.5 $\mu$m. The concavity 20 measures 10×15×0.2 $\mu$m. Therefore, the limitation in the fine processing technique required for manufacturing the Josephson junctions of the DC-SQUID is relaxed.

Figure 4:
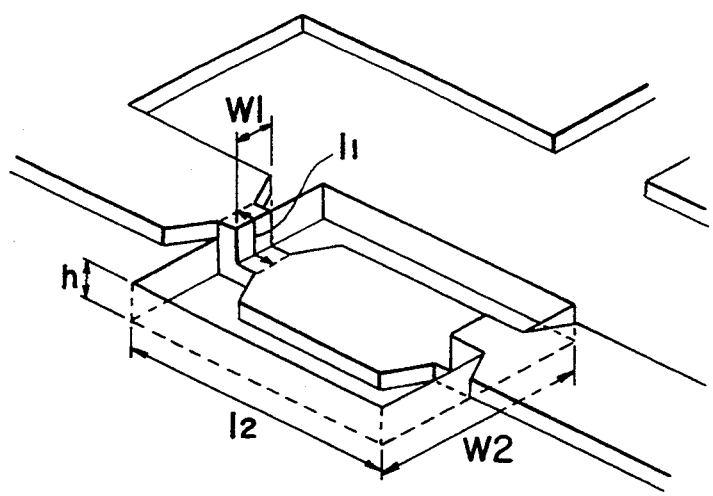
FIG. 4 is an enlarged detail of the encircled region if FIG. 3.

FIG. 4 is an enlarged version of a portion of FIG. 3 illustrating the dimensions of the bridge portions 181 and 182 and the concavity 20. The length of the bridge is 11, width of the bridge is W1, length of the concavity 20 is 12, width of the concavity 20 is W2, and height of the concavity 20 is h.

The above mentioned DC-SQUID was manufactured by the following process. At first, a c-axis orientated Y$_1$Ba$_2$Cu$_3$O$_{7-\delta}$ oxide superconductor thin film of 15 mm square having a thickness of 500 nanometers was deposited by a high frequency magnetron sputtering process on a surface of a SrTiO$_3$ (100) single crystal substrate 2 which had a concavity 20 on the surface. The conditions of the sputtering process were as follows;

| Temperature of substrate | 630° C. |
|---|---|
| Sputtering gases | |
| Ar | 8 sccm |
| O$_2$ | 4 sccm |
| Pressure | 5 × 10$^{-2}$ Torr |

The oxide superconductor thin film was formed in such a manner that the concavity 20 was covered with the oxide superconductor thin film near the center of one side of the oxide superconductor thin film. Grain boundaries were generated in the oxide superconductor thin film at the steps between the surface of the substrate and the bottom of the concavity, which constituted weak links of Josephson junctions.

Then, the oxide superconductor thin film was etched by an ion milling using Ar-ions so that a square washer 10 having a length of a side of 10 mm and a projecting portion on one side, which covered the concavity 20 and would be shaped into the tongue portions 14 and 15.

Thereafter, by an ion milling using Ar-ions, a square hole 11 was formed at the center of the washer and a member 17 was formed at the edge of the projecting portion on the concavity 20 in such a manner that the member 17 had narrow bridge portions 181 and 182 crossing the steps at which grain boundaries had been formed.

Finally, a slit 16 which divided the projecting portion into two tongue portions 14 and 15 was formed to the hole 11. By this, the embodiment of the SQUID in accordance with the present invention was completed.

By using the above mentioned DC-SQUID in accordance with the present invention and a conventional DC-SQUID which had a 100 μm square washer and a 20 μm square hole, a faint magnetic field was measured while the DC-SQUIDs were chilled by liquid nitrogen. The DC-SQUID in accordance with the present invention was capable of measuring a magnetic field having a strength of $1 \times 10^{-9}$ gauss, while the conventional DC-SQUID was only able to measure a magnetic field having a strength on the order of $1 \times 10^{-7}$ gauss.

As explained above, the DC-SQUID of the instant invention has an improved sensitivity or magnetic field resolution which is capable of detecting and measuring the biological magnetism without the superconducting flux transformer. This high sensitivity is realized by a large washer and a small hole in which the ratio of a side length of the washer to that of the hole is 500. In addition, if the DC-SQUID is manufactured in accordance with the above mentioned process, the limitation in the fine processing technique required for manufacturing the DC-SQUID is relaxed. In the above process, of course, the film deposition process of the oxide superconductor is not limited to a high frequency magnetron sputtering process, but any film deposition process such as an MBE (Molecular Beam Epitaxy), a laser ablation, a vacuum evaporation can be employed.

The invention has thus been shown and described with reference to the specific embodiments. However, it should be noted that the present invention is in no way limited to the details of the illustrated structures but converts and modifications may be made within the scope of the appended claims.

We claim:

1. A SQUID comprising:
   a substrate;
   a rectangular washer of an oxide superconductor thin film disposed on a surface of the substrate and having a hole therein and a slit through a side of the washer; and
   a connecting member including at least one Josephson junction, the connecting member connecting portions of the washer across the slit,
   wherein an outer dimensional length of one side of the rectangular washer is at least 100 times greater than a length of a corresponding side of the hole in the washer.

2. A SQUID comprising;
   a substrate;
   a washer of an oxide superconductor thin film on a principal surface of the substrate with a hole therein having a shade similar to that of the washer;
   a slit in one side of the washer and reaching to the hole; and
   at least one Josephson junction by which portions of the washer at both sides of the slit are connected across the slit,
   wherein a ratio of a side length of the washer to a corresponding side length of the hole is at least 100.

3. A SQUID as claimed in claim 2, wherein the Josephson junction is constituted of a gain boundary of the oxide superconductor.

4. A SQUID as claimed in claim 2, wherein the at least one Josephson junction includes two Josephson junctions so as to constitute a DC-SQUID.

5. A SQUID as claimed in claim 2, wherein the substrate is formed of a material selected from the group consisting of a MgO (100) substrate, a SrTiO$_3$ (100) substrate and an yttrium stabilized zirconia (YSZ) substrate.

6. A SQUID as claimed in claim 2, wherein the SQUID is not associated with a superconducting flux transformer.

7. A SQUID as claimed in claim 2, wherein the oxide superconducting thin film comprises a c-axis oriented Y$_1$Ba$_2$Cu$_3$O$_{7-\delta}$.

8. A SQUID as recited in claim 2 wherein the ratio of the side length of the washer to the corresponding side length of the hole is at most 2500.

9. A SQUID claimed in claim 2, wherein the washer and the hole are square.

10. A SQUID claimed in claim 9, wherein a side length of the washer ranges from 1 to 25 mm and a side length of the hole ranges from 10 to 200 μm.

11. A method of using the SQUID as claimed in claim 2, which comprises measuring a magnetic field with the SQUID.

12. A method of claim 11, wherein the magnetic field which is measured is a biologically induced magnetic field.

13. A SQUID as claimed in claim 2, wherein the oxide superconductor thin film is formed of a high-T$_c$ oxide superconductor.

14. A SQUID as claimed in claim 13, wherein the oxide superconductor thin film is formed of an oxide superconductor material selected from the group consisting of a Y—Ba—Cu—O type compound oxide superconductor material, a Bi—Sr—Ca—Cu—O type compound oxide superconductor material, and a Tl—Ba—Ca—Cu—O type compound oxide superconductor material.

15. A SQUID as claimed in claim 13, wherein the oxide superconductor thin film is formed of a high Tc copper-oxide type compound oxide superconductor.

16. A SQUID as claimed in claim 16, wherein the portions of the washer connected across the slit, comprise two tongue portions.

17. A SQUID as claimed in claim 16, wherein leading edges of both of the two tongue portions are connected through two Josephson junctions.

18. A SQUID as claimed in claim 16, wherein a signal processor is connected through the tongue portions.

19. A SQUID comprising:
    a substrate having a substantially planar surface and a hexahedron concavity on the surface;
    a square washer having two tongue portions of an oxide superconductor thin film on the surface of the substrate and having a square hole in the washer;

a slit formed in the washer between the tongue portions to the hole; and a member of an oxide superconductor thin film including two Josephson junctions connected in series, which connects the two tongue portions across the slit, wherein a ratio of a length of a side of the washer to a length of a corresponding side of the hole is 500, and the Josephson junctions are constituted of grain boundaries of the oxide superconductor at steps between the surface of the substrate and a bottom of the concavity.

20. A SQUID as claimed in claim 19, wherein the substrate is substantially planar, but comprises a concavity and wherein the at least one Josephson junction comprises two Josephson junctions which are formed at steps between the surface of the substrate and a bottom of the concavity.

* * * * *